United States Patent
Walecki et al.

(10) Patent No.: US 10,553,623 B2
(45) Date of Patent: Feb. 4, 2020

(54) NON-CONTACT MEASUREMENT OF A STRESS IN A FILM ON A SUBSTRATE

(71) Applicant: Applejack 199 L.P., San Jose, CA (US)

(72) Inventors: Wojciech Jan Walecki, Sunrise, FL (US); Oanh Nguyen, Union City, CA (US)

(73) Assignee: APPLEJACK 199 L.P., Milpitas, CA (US)

( * ) Notice: Subject to any disclaimer, the term of this patent is extended or adjusted under 35 U.S.C. 154(b) by 0 days.

(21) Appl. No.: 15/722,645

(22) Filed: Oct. 2, 2017

(65) Prior Publication Data
US 2018/0308971 A1      Oct. 25, 2018

Related U.S. Application Data

(60) Provisional application No. 62/487,857, filed on Apr. 20, 2017.

(51) Int. Cl.
| | |
|---|---|
| *H01L 27/12* | (2006.01) |
| *G01B 11/30* | (2006.01) |
| *G01B 11/24* | (2006.01) |
| *G01B 11/16* | (2006.01) |
| *G01M 11/08* | (2006.01) |
| *G01L 1/24* | (2006.01) |
| *H01L 21/66* | (2006.01) |

(52) U.S. Cl.
CPC .......... *H01L 27/1262* (2013.01); *G01B 11/16* (2013.01); *G01B 11/24* (2013.01); *G01B 11/30* (2013.01); *G01L 1/24* (2013.01); *G01M 11/081* (2013.01); *H01L 22/12* (2013.01)

(58) Field of Classification Search
CPC ......... H01L 22/12; G01B 11/16; G01B 11/24; G01B 11/30; G01M 11/081; G01L 1/24
USPC ............................................................ 257/48
See application file for complete search history.

(56) References Cited

U.S. PATENT DOCUMENTS

| | | | |
|---|---|---|---|
| 2003/0106378 A1* | 6/2003 | Giannakopoulos | G01B 11/16 73/788 |
| 2013/0068034 A1* | 3/2013 | Takashima | G01N 3/068 73/800 |
| 2015/0226542 A1* | 8/2015 | Sakashita | G01L 1/24 356/33 |
| 2015/0276616 A1* | 10/2015 | Horn | G01N 21/8851 348/87 |
| 2018/0246006 A1* | 8/2018 | Likins, Jr. | G01M 11/081 |

* cited by examiner

*Primary Examiner* — Matthew E Warren
(74) *Attorney, Agent, or Firm* — Maschoff Brennan

(57) ABSTRACT

A method for non-contact measurement of stress in a thin-film deposited on a substrate is disclosed. The method may include measuring first topography data of a substrate having a thin-film deposited thereupon. The method may also include comparing the first topography data with second topography data of the substrate that is measured prior to thin-film deposition. The method may further include obtaining a vertical displacement of the substrate based on the comparison between the first topography data and the second topography data. The method may also include detecting a stress value in the thin-film deposited on the substrate based on a fourth-order polynomial equation and the vertical displacement.

8 Claims, 13 Drawing Sheets

NON-CONTACT MEASUREMENT OF A STRESS IN A FILM ON A SUBSTRATE

CROSS REFERENCE TO RELATED APPLICATION

This application claims the benefit of U.S. Provisional Application No. 62/487,857, filed Apr. 20, 2017, and incorporated herein by reference in its entirety

TECHNICAL FIELD

This disclosure generally relates to non-contact measurement of a stress in a film on a substrate.

BACKGROUND

Substrates having one or more layers of one or more thin-film material deposited thereupon may be used in many applications in the field of electronics. The thickness of such thin-film may range from about a few hundred angstroms to several micrometers.

Due to a variety of reasons including for example, differences in properties of the substrate material and that of the material used for the thin-film deposition, mechanical stress may develop in the thin-film. Mechanical stress developed in the thin-film can be either compressive or tensile. In a substrate having the thin-film deposited on top, development of compressive stress in the thin-film may cause the substrate to bow in a concave direction while development of tensile stress in the thin-film may cause the substrate to bow in a convex direction. Thus, in instances in which a planar substrate is subjected to thin-film deposition, compressive as well as tensile stresses developed in the thin-film may cause a surface of the substrate to deviate from planarity. Mechanical stress in thin-films is a potential cause of the substrate failure due to delamination and cracking of thin-films.

SUMMARY

In accordance with one embodiment, a method for non-contact measurement of stress in a thin-film deposited on a substrate is disclosed. The method may include measuring first topography data of a substrate having a thin-film deposited thereupon. The method may also include comparing the first topography data with second topography data of the substrate that is measured prior to thin-film deposition. The method may further include obtaining a vertical displacement of the substrate based on the comparison between the first topography data and the second topography data. The method may also include detecting a stress value in the thin-film deposited on the substrate based on a fourth-order polynomial equation and the vertical displacement.

In accordance with an embodiment, the first topography data and the second topography data may include at least a curvature of the substrate having the thin-film deposited thereupon and a curvature of the substrate prior to the thin-film deposition.

In accordance with another embodiment, each of the first topography data and the second topography data may correspond to at least one predefined discrete point on the substrate.

In accordance with some embodiments, the method may include modelling a shape of the substrate prior to the thin-film deposition and a shape of the substrate having the thin-film deposited thereupon. The method may also include using the fourth-order polynomial equation and using a fitting procedure to determine stress of the thin-film by fitting polynomial parameters in the fourth-order polynomial equation.

In accordance with another embodiment, the method may include modelling a difference in a vertical position of the substrate at the at least one predefined discrete point on the substrate prior to the thin-film deposition and a vertical position of the substrate at the at least one predefined discrete point on the substrate after the thin-film deposition on the substrate. The method may also include using the modeled difference to detect stress in the thin-film.

In accordance with an embodiment, points of the at least one predefined discrete point may correspond to a region at about a center of the substrate and a further region of the substrate. The further region may be away from the center of the substrate.

Further, in accordance with an embodiment, the fourth-order polynomial equation may include a first polynomial equation corresponding to a center region of the substrate, the center region being proximate to a center of symmetry of the substrate, and a second polynomial equation corresponding to a further region of the substrate, the further region being away from the center region of the substrate.

In one embodiment, the substrate may be supported from below by a first edge defining element and a second edge defining element separated by a predefined separating value. The first and second edge defining elements may be positioned symmetrically with respect to an axis of the substrate.

In another embodiment, the substrate may be supported from below by at least two parallel rows including a series of linearly placed edge defining elements. The series of linearly placed edge defining elements of each of the two parallel rows may be positioned symmetrically with respect to an axis of the substrate.

In accordance with another embodiment, an apparatus for non-contact based measurement of stress in a thin-film deposited on a substrate is disclosed. The apparatus may include a topography measurement unit configured to determine topography data of a substrate. The apparatus may also include a processor configured to compare first topography data of the substrate having a thin-film deposited thereupon with second topography data of the substrate that is measured prior to the thin-film deposition. The processor may also be configured to obtain a vertical displacement of the substrate based on the comparison between the first topography data and the second topography data. The processor may also be configured to detect a stress value in the thin-film deposited on the substrate based on a fourth-order polynomial equation and the vertical displacement.

In accordance with another embodiment, an apparatus for non-contact based measurement of stress in a thin-film deposited on a substrate is disclosed. The apparatus may include multiple LED panels configured to emit a beam of light towards a surface of a substrate. The multiple LED panels may be arranged to include an opening at about a center of the multiple LED panels to allow flow of filtered air above the surface of the substrate. Further, the apparatus may include multiple cameras configured to capture a reflected beam of light that includes at least a portion of the emitted beam as reflected from the surface of the substrate. The apparatus may also include a detector unit to determine topography data of the substrate prior to a thin-film deposition and after the thin-film deposition on the substrate. The apparatus may further include a processor. The detector unit may be configured to detect a change in an optical path of the reflected beam of light to determine topography data of the substrate.

BRIEF DESCRIPTION OF THE DRAWINGS

The present disclosure is illustrated by way of example, and not by way of limitation, in the figures of the accompanying drawings in which.

DETAILED DESCRIPTION OF SOME EXAMPLE EMBODIMENTS

The present disclosure is directed to methods of detecting stress in a thin-film deposited on a substrate. According to an aspect of an embodiment, a method for non-contact measurement of stress in a thin-film deposited on a substrate based on fourth-order polynomial equations is provided. The fourth-order polynomial equations as provided in the present disclosure may be applicable to measurement of stress in thin-film deposited on glass panels and may be considered an approximate solution for measurement of stress in a thin-film deposited on large glass panels. Based on the measured shape of the thin-film deposited glass panel, a fitting procedure may be applied to the fourth-order polynomial equations to detect the value of stress. Further, the present disclosure also provides an apparatus including a topography measuring unit to measure the stress in a thin-film deposited on a glass panel.

According to an embodiment of the present disclosure, the fourth-order polynomial equations as provided in the present disclosure may include polynomial parameters that may describe the shape of the substrate. The values for these polynomial parameters may be determined by optimizing total potential energy acting upon the substrate. The values for these polynomial parameters, also referred to as coefficients in this disclosure, may be used to calculate shape of the substrate for different values of stress. Then a fitting procedure can be applied to determine stress in a substrate having thin film deposited thereupon based on the shape of substrate under test, and the shapes thus calculated, using the fourth order polynomial equations. The shape thus calculated may also be referred to as a modelled shape in this disclosure. The foregoing description shall explain various embodiments of the present disclosure which enable non-contact based measurement of stress in a thin film deposited on the substrate.

Figure 1:
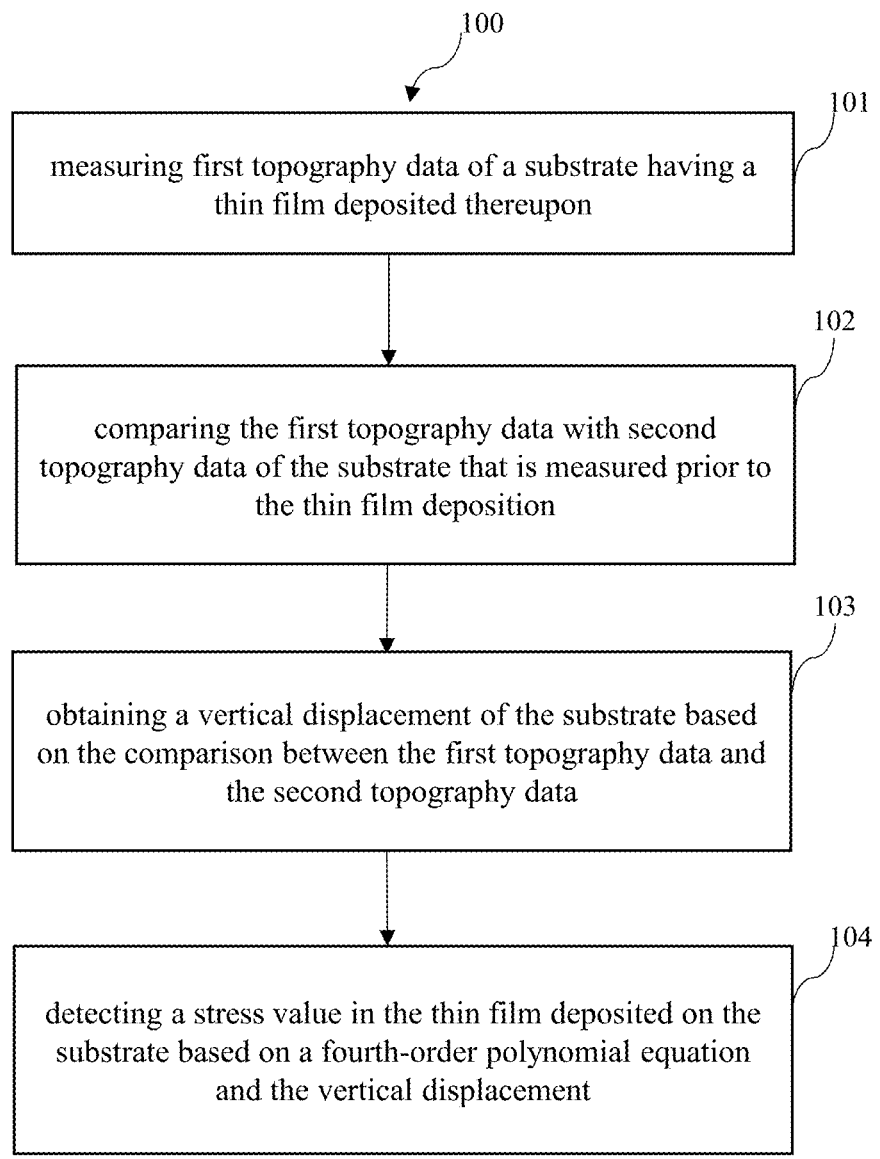
FIG. 1 illustrates a method of non-contact based measurement of stress in a thin-film deposited on a substrate, in accordance with an embodiment of the present disclosure.

FIG. 1 illustrates a method 100 of non-contact measurement of stress in a thin-film deposited on a substrate, in accordance with one embodiment. In one example, the substrate on which the method 100 is applicable may be a glass panel. As illustrated in FIG. 1, the method 100 may begin at step 101, measuring first topography data of a substrate having a thin-film deposited thereupon. According to an embodiment of the present disclosure, the first topography data may be measured by one or more devices including, but not limited to, interferometers, laser scanners, and techniques includes but not limited to, triangulation probes.

Further, the method 100 may include step 102, comparing the first topography data as obtained in step 101, with second topography data of the substrate that is measured prior to the thin-film deposition. According to one embodiment, the second topography data of the substrate may be measured prior to the thin film deposition on the substrate, using a similar technique that is used later for measuring the first topography data of the substrate. According to another embodiment, the second topography data of the substrate may be measured prior to the thin film deposition on the substrate, using one or more known techniques. In some embodiments, the first topography data may include the measured curvature of the substrate having the thin-film deposited thereupon. In these and other embodiments, the second topography data may include the measured curvature of the substrate prior to the thin-film deposition. Further, the method 100 may include step 103, obtaining a vertical displacement of the substrate based on the comparison between the first topography data and the second topography data in step 102. The vertical displacement of the substrate or the out-of-plane displacement of the substrate may be a result from an intrinsic stress in the thin-film formed upon the substrate. The out-of-plane displacements in the substrate may occur in any or both of the two principal x-y directions within a horizontal plane lying in the substrate, and also along a third principal direction perpendicular to said plane. A substrate including vertical displacement as explained herein shall be referred to as a 'bent substrate' hereafter in this disclosure.

Further, the method 100 may include step 104, detecting a stress value in the thin-film deposited on the substrate based on one or more fourth-order polynomial equations and the vertical displacement obtained in step 103. In some embodiments, the fourth-order polynomial equations provided in the present disclosure may represent the vertical displacements in the substrate within the two principal directions within a plane lying within the substrate and along the third principal direction perpendicular to said plane. The fourth order polynomial equations shall be explained in detail in the foregoing description.

Modifications, additions, or omissions may be made to the method 100 without departing from the scope of the present disclosure. For example, the operations of method 100 may be implemented in differing order. Additionally or alternatively, two or more operations may be performed at the same time. Furthermore, the outlined operations and actions are only provided as examples, and some of the operations and actions may be optional, combined into fewer operations and actions, or expanded into additional operations and actions without detracting from the essence of the disclosed embodiments.

Figure 2:
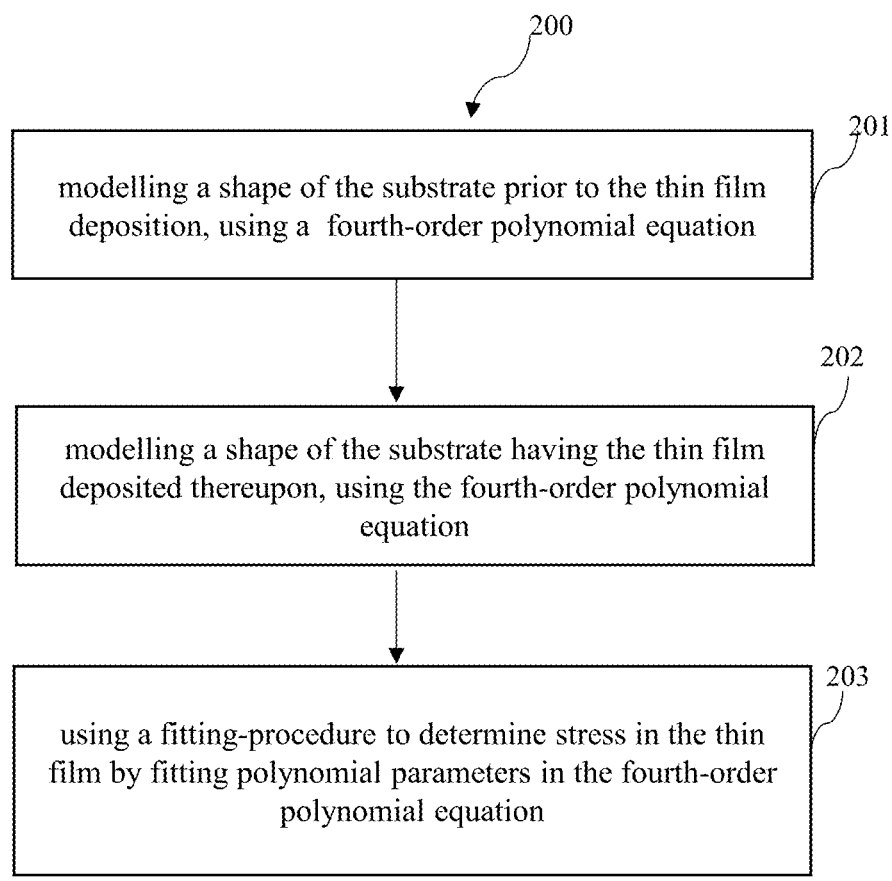
FIG. 2 illustrates a method of non-contact based measurement of stress in a thin-film deposited on a substrate, in accordance with an embodiment of the present disclosure.

FIG. 2 illustrates a method 200 of determining stress in the thin-film on the substrate, wherein the first topography data and the second topography data include a corresponding curvature of the substrate. The method 200 may include step 201, modelling a shape of the substrate prior to the thin-film deposition, using fourth-order polynomial equations that may correspond to different regions as detailed below. As explained earlier in the present disclosure, a fourth-order polynomial equation includes polynomial parameters which may be determined to calculate, or model, a shape of the substrate. Further, the method 200 may include step 202, modelling a shape of the substrate having the thin-film deposited thereupon, using the fourth-order polynomial equations as used in step 201.

Further, the method 200 may include step 203, using a fitting-procedure to determine stress in the thin-film by fitting polynomial parameters in the fourth-order polynomial equations, used in step 201 and step 202. In one instance, the polynomial parameter is a predicted curvature of the substrate. The curvature of the substrate, as obtained from the measured topography, may be compared with curvature, as predicted from the fourth-order polynomial equations. Further, based on the compared results, a deviation between the measured curvature and the predicted curvature may be obtained. Using the fitting-procedure, the deviation between the measured curvature and the predicted curvature is optimized to obtain a value of a measured stress. In one example, the fitting procedure used is a mean square fit or robust fit.

In one instance, the curvature of the substrate may include a vertical displacement at one or more prescribed positions on the substrate. The one or more prescribed positions may be used to define respective discrete points on the substrate. In accordance with an embodiment, each of the first topography data and the second topography data may correspond to at least one predefined discrete point on the substrate. In some embodiments, the first topography data and the second topography data may represent a vertical position of the prescribed points. In these and other embodiments, the vertical position may be a position with respect to edge defining elements S1 and S2, on which the substrate may be supported, as explained later in the specification in relation to FIG. 4. Further, the predefined discrete points may correspond to either a region at about a center of the substrate or a further region of the substrate. The further region may be away from the center region of the substrate. The center region can be a region proximate to a center of symmetry of the substrate. The further region can be a region proximate to the edges of the substrate.

Modifications, additions, or omissions may be made to the method 200 without departing from the scope of the present disclosure. For example, the operations of method 100 may be implemented in differing order. Additionally or alternatively, two or more operations may be performed at the same time. Furthermore, the outlined operations and actions are only provided as examples, and some of the operations and actions may be optional, combined into fewer operations and actions, or expanded into additional operations and actions without detracting from the essence of the disclosed embodiments.

Figure 3:
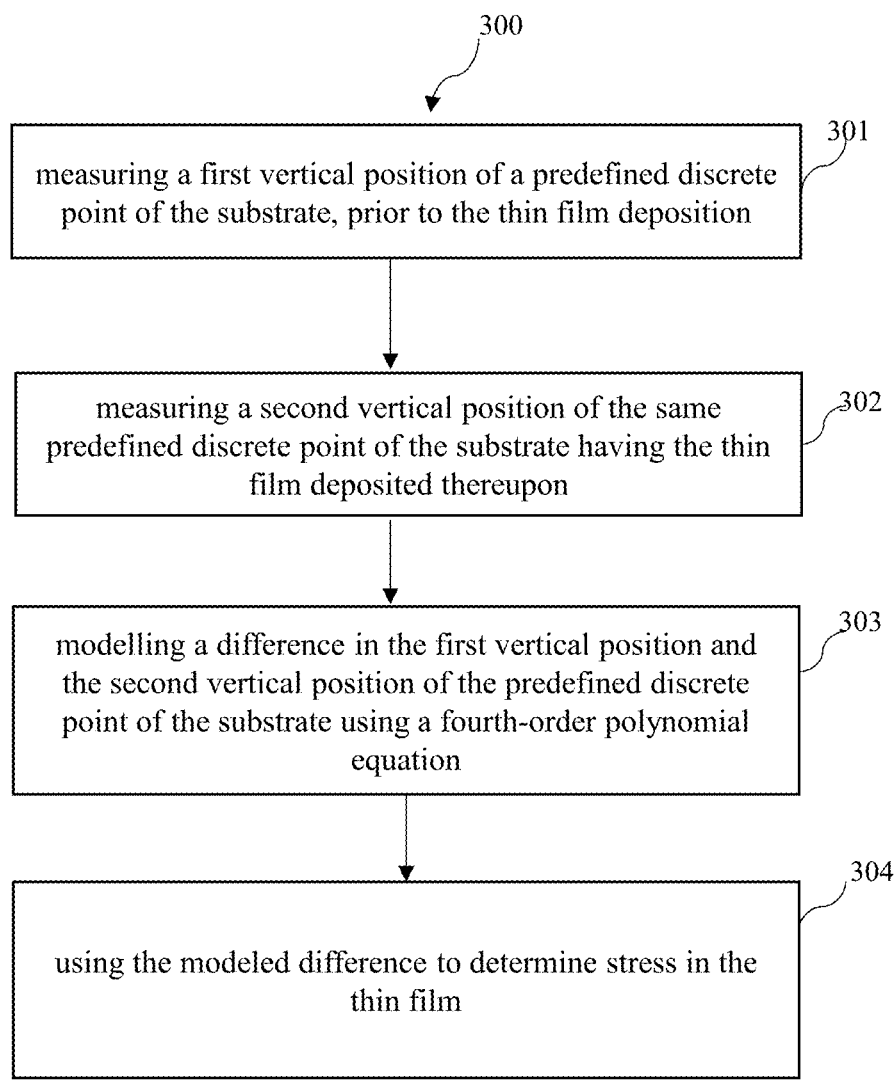
FIG. 3 illustrates a method of non-contact based measurement of stress in a thin-film deposited on a substrate, in accordance with an embodiment of the present disclosure.

FIG. 3 illustrates a method 300 of determining stress in the thin-film on the substrate, wherein the first topography data and the second topography data corresponds to at least one predefined discrete point on the substrate. The method 300 may include step 301, measuring a first vertical position of a predefined discrete point of the substrate, prior to the thin-film deposition. The method 300 may include step 302, measuring a second vertical position of the predefined discrete point of the substrate having the thin-film deposited thereupon. The first vertical position and the second vertical position as measured may be in relation to a particular predefined discrete point. The method 300 may include step 303, modelling a difference in the first vertical position and the second vertical position of the predefined discrete point of the substrate using a fourth-order polynomial equation. The method 300 may include step 304, using the modeled difference to determine stress in the thin-film. The stress may be determined using a similar fitting-procedure as disclosed above.

The foregoing description shall now explain the fourth-order polynomial equations, in accordance with various embodiments of the present disclosure. In accordance with some embodiments, the present disclosure provides a first fourth-order polynomial equation corresponding to the center region of the substrate, and a second fourth-order polynomial equation corresponding to the further region of the substrate. However, it is understood that the fourth-order polynomials may be determined for and correspond to other regions on the substrate.

In some embodiments, the fourth-order polynomial equations may include coefficients determined by optimizing a total potential energy action upon the substrate having the thin film deposited thereupon. Further, the method 100 comprises of predicting a curvature of the substrate using the determined coefficients.

Figure 4:
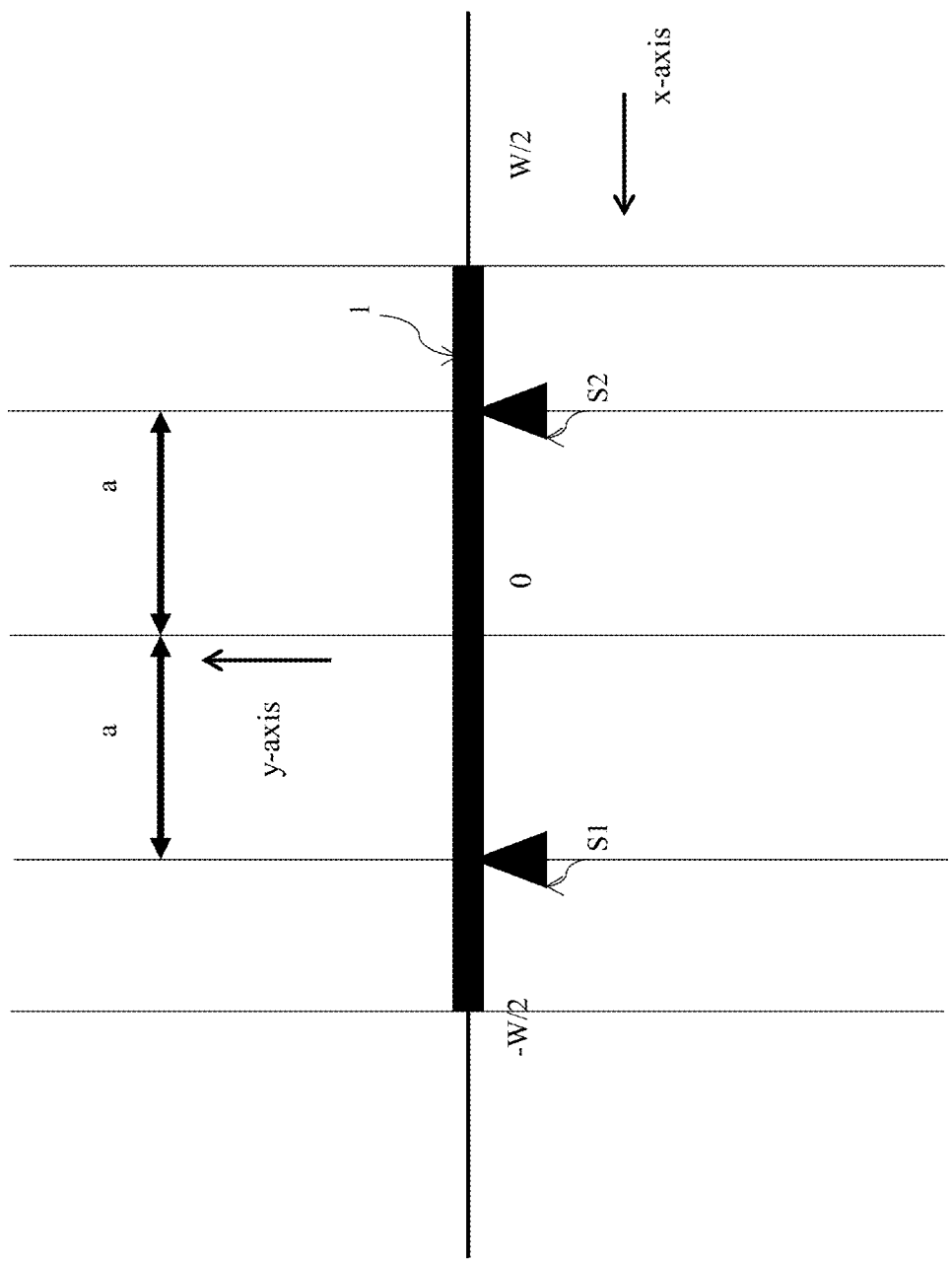
FIG. 4 illustrates a glass panel supported on two edge defining elements, in accordance with an embodiment of the present disclosure.

FIG. 4 illustrates a structure of a flat glass panel 1, having a width W, supported from below by a first edge defining element S1 and second edge defining element S2. In some embodiments, the first and second edge defining elements S1 and S2 are positioned symmetrically with respect to an axis of symmetry, denoted at point x=0, of a horizontal x-y plane lying within the glass panel 1. As shown in FIG. 4 the two edge defining elements S1 and S2 are separated by a distance 2a, the distance a being measured from the axis of symmetry of the flat glass panel 1.

The following analytical equations are based on symmetry of the substrate, e.g., glass panel 1, as shown in FIG. 4.

In some embodiments, the shape of the substrate including vertical displacements is described by a function w(x), wherein w(x) is an even function. In these and other embodiments, the fourth-order polynomial equations are based on the symmetry of the substrate as illustrated in FIG. 1. In these or other embodiments, the polynomial that may correspond to the center region the coefficients for the $x^1$ or $x^3$ terms may be zero.

A first region I corresponding to a center region is considered. The center region of the substrate lies between the two support points '−a' and 'a', referring the FIG. 4. In some embodiments, the first polynomial equation for a substrate supported by edge defining elements S1 and S2, separated by a distance 2a, as shown in FIG. 4, is as follows:

$$w_1(x)=(x-a)(x+a)(Q_2x^2+Q_0) \text{ for } x\geq 0, x\leq a \quad \text{(Equation 1)}$$

wherein, $w_1(x)$ is an even function representing the shape of the substrate, and where $Q_2$, $Q_0$ are unknown coefficients which will be found when optimizing free energy of the glass.

The glass panel may also be divided into a second region II. The second region II may be a region further from the center region of the substrate from the support points to the edge of the glass panel. The equation w(x) may also be a fourth-order polynomial equation which equals zero at the support point located at x=a. In some embodiments, the second polynomial equation for a substrate supported by edge defining elements S1 and S2, separated by a distance 2a, as shown in FIG. 4, is as follows:

$$w_2(x)=(x-a)(T_0+T_1(x-a)^1+T_2(x-a)^2+T_3(x-a)^3) \text{ for } x>a \quad \text{(Equation 2)}$$

wherein, $w_2(x)$ is an even function representing the shape of the substrate from the point a to the edge of the glass pane. The shape of the substrate may thus be described as:

$$w(x) = {}_{w2(x) \text{ for } x>a}{}^{w1(x) \text{ for } 0\leq x\leq a}$$

In some embodiments, the function w(x) and the derivative of the function w(x), $$\frac{dw(x)}{dx}$$

may be continuous at each point in general and at x=a in particular. The continuity of $$\frac{dw(x)}{dx}$$

at x=a implies:

$$\frac{dw_1(x)}{dx} = \frac{dw_2(x)}{dx}$$

at x=a. Solving this equation and substituting a for x, results in:

$$T_0=2a(Q_2a^2+Q_0) \quad \text{(Equation 3)}$$

For sufficiently small curvatures we can approximate curvature of the glass K by $$\kappa = \frac{d^2w(x)}{dx^2}$$

The potential energy stored in the bent substrate plate per unit area is given by:

$$E_{elasticplate} = \text{Plate}\left(\frac{d^2w(x)}{dx^2}\right)^2 \quad \text{(Equation 4)}$$

where Plate = $EY*h^3/(24(1-v^2))$, where EY is Young's modulus,
h is glass plate thickness, and v is the Poisson's ratio.
The gravitational potential energy is:

$$E_{gravity}=\text{Grav } w(x) \quad \text{(Equation 5)}$$

where Grav=gρh
where g is free fall acceleration having usual value 9.8 m/s2, h is the glass plate thickness, and ρ is substrate plate density. It would be apparent to those skilled in the art that the density of the thin-film has been neglected which is usually justifiable approximation. However it may be included by substituting ρh by surface density of the thin-film coated glass substrate.

The elastic energy density stored in a bent film is:

$$E_{film} = \text{Film}\frac{d^2w(x)}{dx^2} \quad \text{(Equation 6)}$$

$$\text{where Film} = -\left(\frac{h}{2}\right)\sigma t,$$

where tensile intrinsic stress in the thin-film σ has positive and t is thickness of thin-film. In some instances it may be assumed that the stress value σ does not change as a result of bending.

Total free energy density in the glass panel is equal to:

$$E=E_{elasticplate}+E_{gravity}+E_{film} \quad \text{(Equation 7)}$$

Therefore, the total energy in the glass panel per unit length in direction of Y-axis is equal $$E_{TOT}=2\int_0^{W/2} E \, dx \quad \text{(Equation 8)}$$

By substituting Equation 7, and later Equations 6, 5, 4 into Equation 8 we can express $E_{TOT}$ as a function of w(x), and $$\frac{d^2w(x)}{dx^2}.$$

$$E_{TOT} = 2\int_0^{W/2} E\left(w, \frac{d^2w}{dx^2}\right)dx$$

where E is an algebraic function, and we can split the above integral into two parts:

$$E_{TOT} = 2\left[\int_0^a E\left(w, \frac{d^2w}{dx^2}\right)dx + \int_a^{W/2} E\left(w, \frac{d^2w}{dx^2}\right)dx\right]$$

By performing integrations using Equations 1, and 2, the following equations are derived:

$$E_{TOT}=f(Q_0,Q_2,T_1,T_2,T_3)$$

where $f(Q_0,Q_2,T_1,T_2,T_3)$ is an algebraic function of its arguments. It should be noted that $f(Q_0,Q_2,T_1,T_2,T_3)$ does not depend on $T_0$ since it can be defined in terms of $Q_0,Q_2$ as shown in Equation 3.

A minimum of function $f(Q_0,Q_2,T_1,T_2,T_3)$ may be found with respect to its arguments. This leads to a following set of five linear equations:

$$\begin{cases} \frac{\partial f(Q_0, Q_2, T_1, T_2, T_3)}{\partial Q_0} = 0 \\ \frac{\partial f(Q_0, Q_2, T_1, T_2, T_3)}{\partial Q_2} = 0 \\ \frac{\partial f(Q_0, Q_2, T_1, T_2, T_3)}{\partial T_1} = 0 \\ \frac{\partial f(Q_0, Q_2, T_1, T_2, T_3)}{\partial T_2} = 0 \\ \frac{\partial f(Q_0, Q_2, T_1, T_2, T_3)}{\partial T_3} = 0 \end{cases}$$

This system of these five linear equations may be solved:

$$Q_0 = R[-(3W^2 - 12Wa + 2a^2 + 24K)/96]$$

$$Q_2 = R\left[-\frac{1}{48}\right]$$

$$T_1 = R(-(W^2 - 4Wa + 4*a^2 + 8K)/32]$$

$$T_2 = R[-(2a - W)/24]$$

$$T_3 = R\left[-\frac{1}{48}\right]$$

where $$= \frac{Grav}{Plate}, \text{ and } K = \frac{Film}{Grav}.$$

Coefficients R and K may be measurements of strength of various components of potential energy.

Furthermore, using Equation 2 we can derive an explicit formula for $T_0$:

$$T_0 = R\left[2\left(-\frac{1}{48}\right)a^3 + a([-(3W^2 - 12Wa + 2a^2 + 24K)/96])\right]$$

or $$T_0 = R[+a([-(W^2 - 4Wa + 2a^2 + 8K)/32])]$$

The explicit analytical formulas of $Q_0,Q_2,T_1,T_2,T_3$, as disclosed above, enable us to calculate shape of the glass plate for given film and substrate parameters. Further, once fitting-procedure is applied, as disclosed above, the intrinsic stress value may be determined at least by analytical equation 6, as disclosed above.

Modifications, additions, or omissions may be made to FIG. 4 without departing from the scope of the present disclosure. For example, in some embodiments, FIG. 4 may include any number of other components that may not be explicitly illustrated or described.

Figure 5:
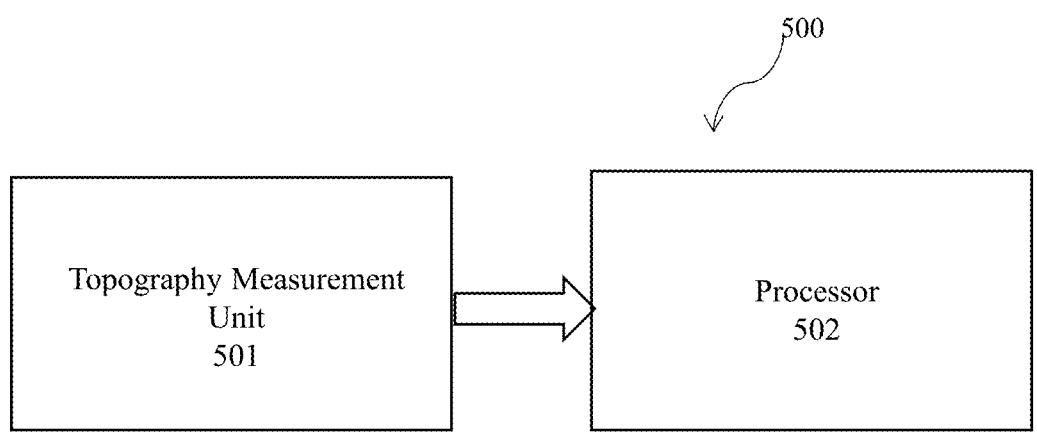
FIG. 5 illustrates an apparatus for non-contact based measurement of stress in a thin-film deposited on a substrate, in accordance with an embodiment of the present disclosure.
Figure 6:
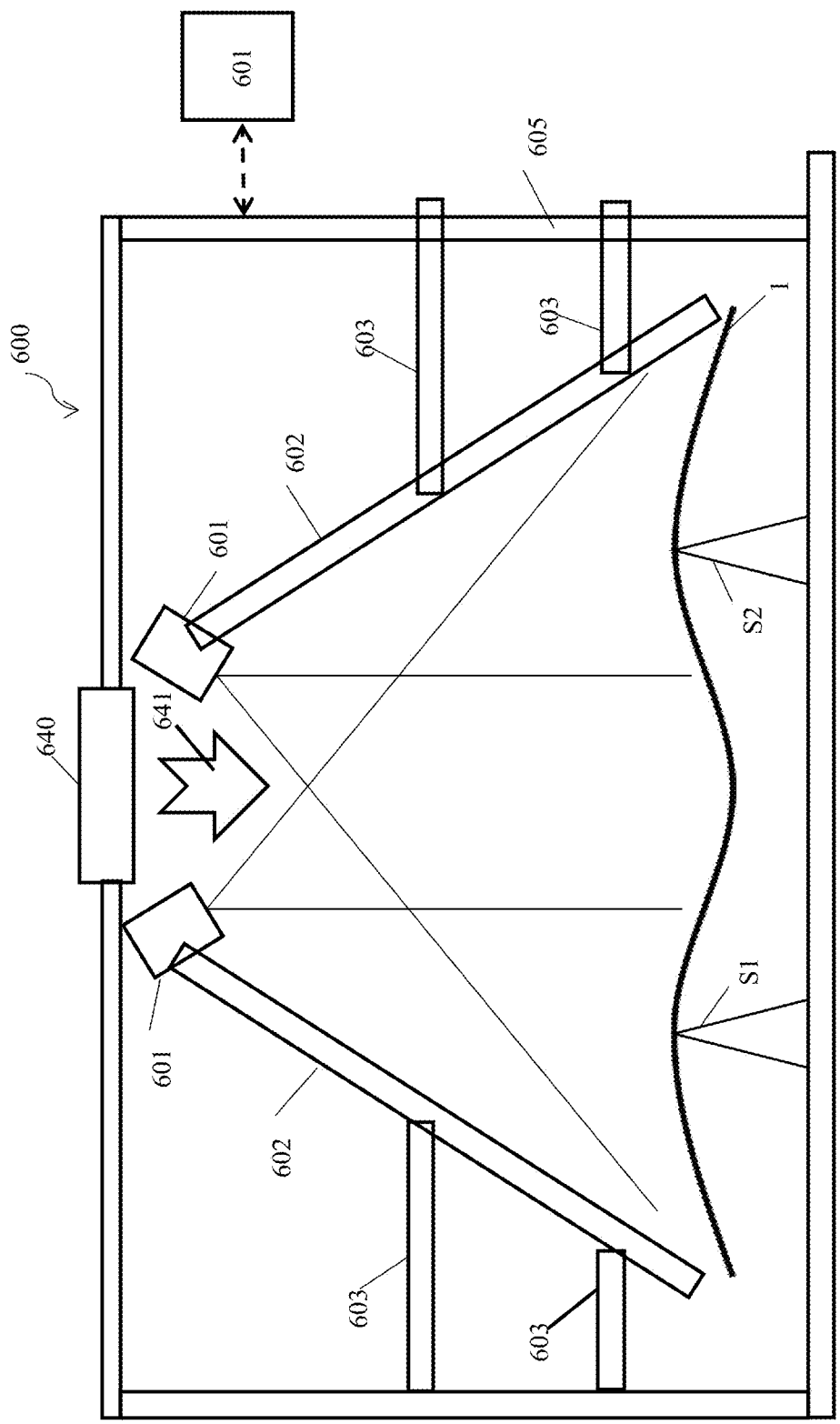
FIG. 6 illustrates an apparatus to determine a topography data of the substrate, in accordance with an embodiment of the present disclosure.

FIG. 5 illustrates a system 500 for non-contact based measurement of stress in a thin-film deposited on a substrate. The system 500 may include a topography measurement unit 501 and a computing system 502. In some embodiments, the topography measurement unit 501 may be configured to determine topography data of a substrate, prior to the thin-film deposition and after the thin-film deposition on the substrate, and communicate the determined topography data to the computing system 502. It should be understood that the topography measurement unit 501 may include one or more known devices to measure topography data of the substrate. For example, the topography measurement unit 501 may include, but not limited to, interferometers, laser scanners and triangulation probes. By way of an example, the topography measurement unit 501 may include an apparatus 600, as shown in FIG. 6. FIG. 6 shall be explained in the next section.

Further, the computing system 502 may be configured to detect a stress value in the thin-film deposited on the substrate in accordance with the methods as disclosed in FIGS. 1, 2, and 3. The system 500 as disclosed herein may provide real-time monitoring of stress as developed in a thin-film-deposited on the substrate. The computing system 502 may be further coupled to a display unit (not shown) for displaying results of data as processed according to the present disclosure. In some further embodiment, the results of the computing system 502 may be used to control the thin-film deposition process on the substrate.

The computing system 502 may include a processor 550, a memory 552, and data storage 554. The processor 550, the memory 552, and the data storage 554 may be communicatively coupled.

In general, the processor 550 may include any suitable special-purpose or general-purpose computer, computing entity, or processing device including various computer hardware or software modules and may be configured to execute instructions stored on any applicable computer-readable storage media. For example, the processor 550 may include a microprocessor, a microcontroller, a digital signal processor (DSP), an application-specific integrated circuit (ASIC), a Field-Programmable Gate Array (FPGA), or any other digital or analog circuitry configured to interpret and/or to execute program instructions and/or to process data. Although illustrated as a single processor in FIG. 5, the processor 550 may include any number of processors configured to, individually or collectively, perform or direct performance of any number of operations described in the present disclosure. Additionally, one or more of the processors may be present on one or more different electronic devices, such as different servers.

In some embodiments, the processor 550 may be configured to interpret and/or execute program instructions and/or process data stored in the memory 552, the data storage 554, or the memory 552 and the data storage 554. In some embodiments, the processor 550 may fetch program instructions from the data storage 554 and load the program instructions in the memory 552. After the program instructions are loaded into memory 552, the processor 550 may execute the program instructions.

The memory 552 and the data storage 554 may include computer-readable storage media for carrying or having computer-executable instructions or data structures stored thereon. Such computer-readable storage media may include any available media that may be accessed by a general-purpose or special-purpose computer, such as the processor 550. By way of example, and not limitation, such computer-readable storage media may include tangible or non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store particular program code in the form of computer-executable instructions or data structures and which may be accessed by a general-purpose or special-purpose computer. Combinations of the above may also be included within the scope of computer-readable storage media. Computer-executable instructions may include, for example, instructions and data configured to cause the processor 550 to perform a certain operation or group of operations.

Modifications, additions, or omissions may be made to the system 500 without departing from the scope of the present disclosure. For example, in some embodiments, system 500 may include any number of other components that may not be explicitly illustrated or described.

FIG. 6 illustrates an example apparatus 600 which may be used to measure the first topography data and the second topography data of the substrate, based on a triangulation probe technique. A similar technique to measure a shape of the glass panel 1, as described in Finot Et. Al in J. Appl. Phys, volume 81, page 3457 (1997), may be applied by the apparatus 600 disclosed herein. However, in some embodiments, the apparatus 600 may include a modification to the apparatus as disclosed in Finot to incorporate a provision for clean-room applications. Details of such modification shall become apparent through the foregoing disclosure.

The apparatus 600 may include a fan and a filter unit 640, a set of cameras 601, an array of LED (light emitting diodes) positioned on, or behind LED panels 602, supporting bars 603 supporting the LED panels, a tool frame 605 to which the supporting bars 603 are attached. Further, the glass panel 1 may reside on edge defining elements S1 and S2. Edge defining elements S1 and S2 may be attached to the tool frame 605.

The LED panels 602 may be configured to emit a beam of light towards a surface of the glass panel 1. As illustrated in FIG. 6, the LED panels 602 are arranged in a slanted manner, to include an opening at about a center for allowing flow of filtered air above the surface of the glass panel 1. Further, the filtered air 641 may enter an enclosure defined by the tool frame 605 as indicated by an arrow pointing towards the glass panel 1. Thus, the arrangement illustrated in FIG. 6 may allow the flow of filtered air applicable for clean-room applications.

The cameras 601 may be configured to capture a reflected beam of light that includes at least a portion of the emitted beam as reflected from a surface of the glass plate 1. Although two cameras 601 are shown in FIG. 1, a single camera 601 may also be used in some of the embodiments of the present disclosure.

Further, the apparatus 600 may include a detector unit 606 configured to detect topography data of the substrate prior to a thin-film deposition and after the thin-film deposition on the substrate. In some embodiments, the detector unit 606 may be configured to detect a change in optical path of the reflected beam of light to determine topography data of the substrate. In one example, the LED panel 602 may be used to direct the emitted beam to the surface of the glass panel 1. When the reflective surface is curved, the reflected emitted beam is distorted and thereby the reflected beam acquires an optical path difference or phase change associated with the curvature of the surface of the glass panel 1, under measurement. The pinhole camera 601 may capture each point within the illuminated area on the surface of the glass panel. Thus, the curvature information at any point along any direction within the illuminated area can be obtained.

The foregoing description shall now explain an example of determining topography of a bent glass panel 1 vis-a v-s a flat glass panel, using the apparatus 600.

Figure 7:
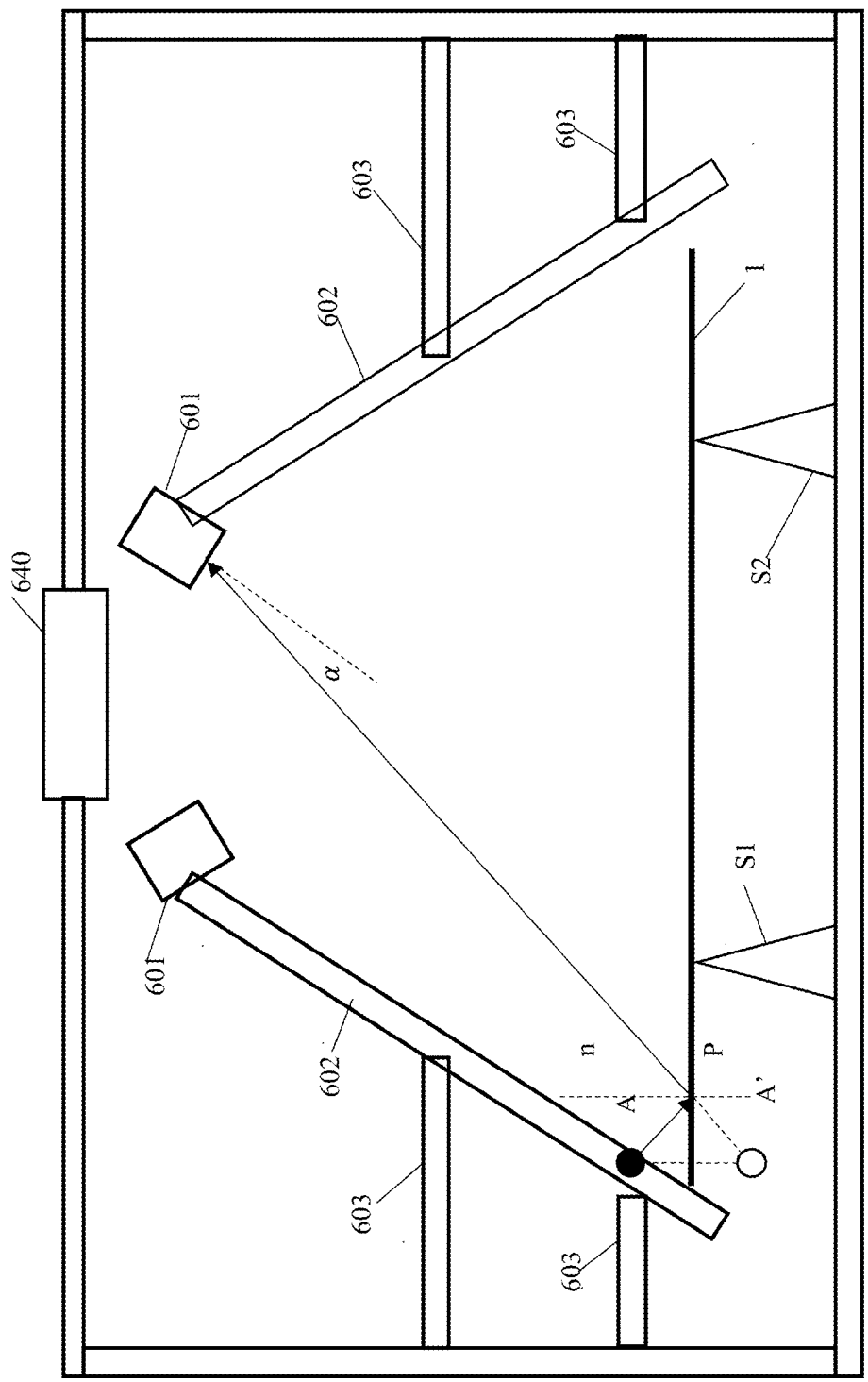
FIG. 7 illustrates a flat glass panel undergoing topography measurement, in accordance with an embodiment of the present disclosure.

FIG. 7 illustrates a flat glass panel 1 undergoing topography measurement by the apparatus 600, illustrated in FIG. 6. As illustrated in FIG. 7, pinhole camera 601 receives a reflected beam. The reflected beam emanates from a point P on the flat glass panel 1, the point P corresponds to LED A from the LED panel 602 which can otherwise be treated as emanating from a virtual image A'. The pinhole camera 601 is configured to capture the reflected beam, which is supposedly making an angle $\alpha$ with respect to an imaginary normal line corresponding to the pinhole camera.

Figure 8:
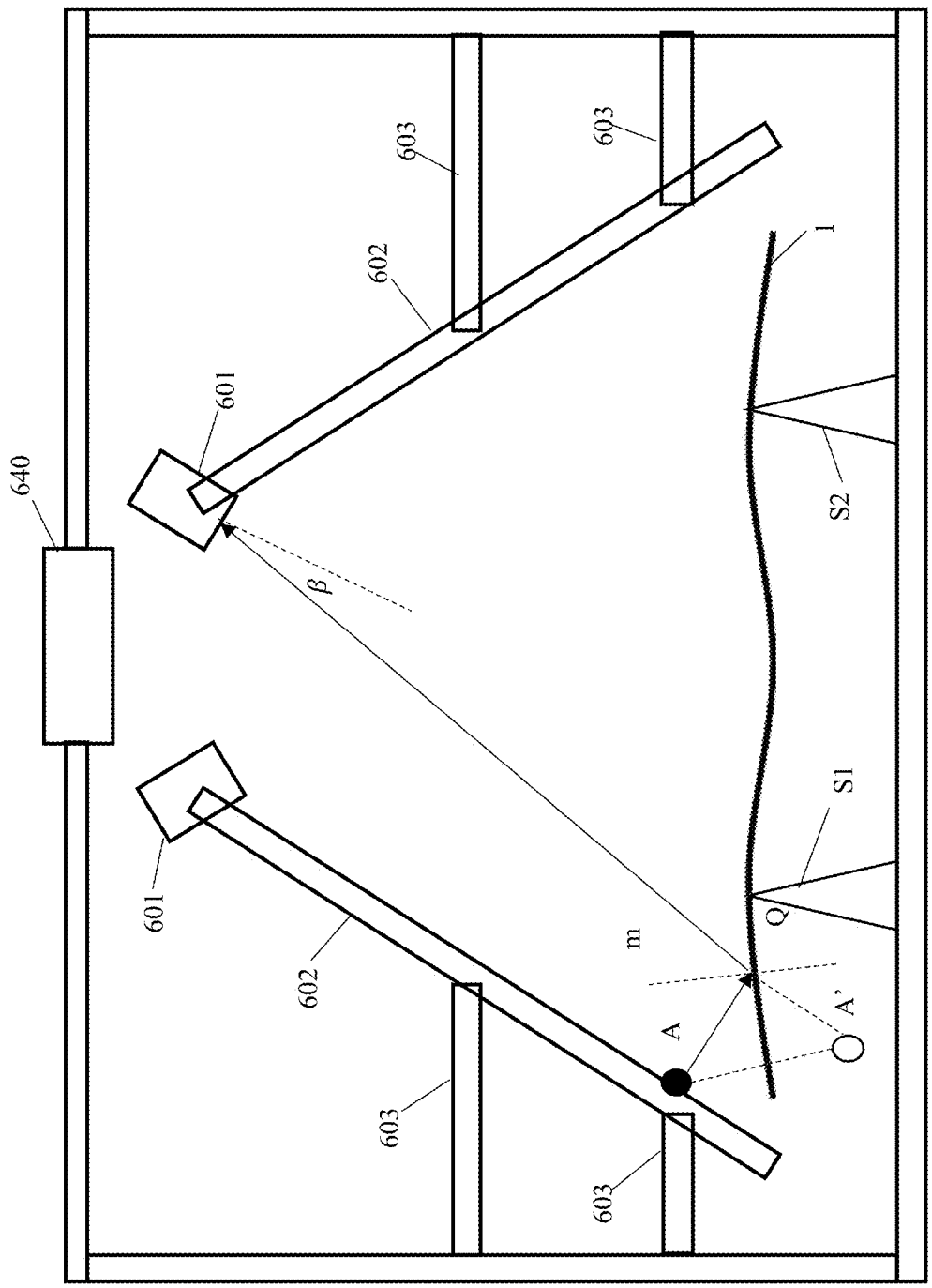
FIG. 8 illustrates a bent glass panel undergoing topography measurement, in accordance with an embodiment of the present disclosure.

FIG. 8 illustrates a bent glass panel 1 undergoing topography measurement by the apparatus 600, illustrated in FIG. 6. As illustrated in FIG. 8, pinhole camera 601 receives a reflected beam. Because the glass panel 1 is bent, the reflected beam emanates from a point Q on the surface of the bent glass panel which corresponds to LED A from the LED panel 602. Similar to FIG. 7 the pinhole camera 601 is configured to capture the reflected beam which is supposedly making an angle $\beta$ with respect to an imaginary normal line corresponding to the pinhole camera.

Figure 9:
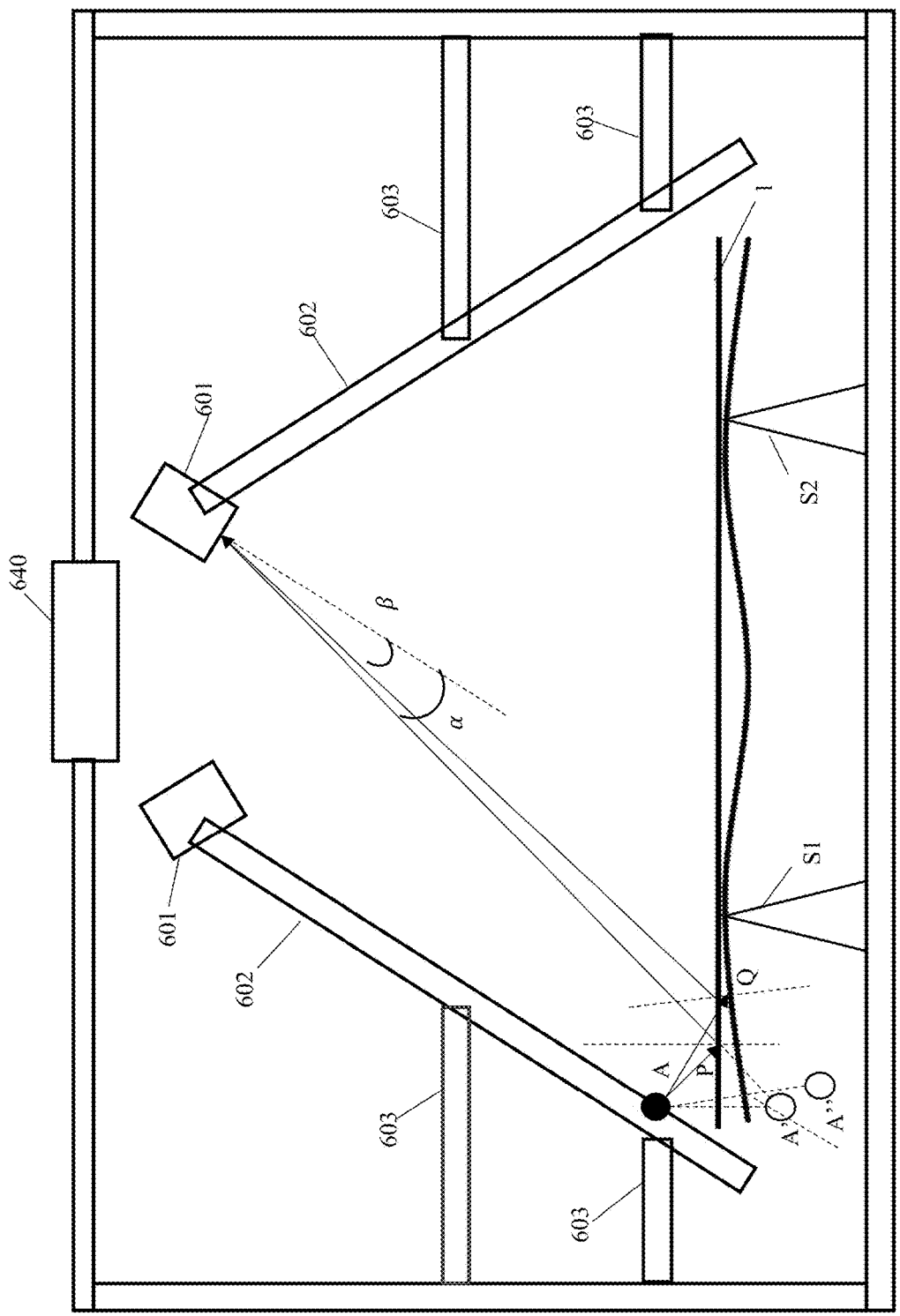
FIG. 9 illustrates a combined effect of the reflected beam of the surface of the flat glass panel and bent glass panel, in accordance with an embodiment of the present disclosure thin-film

FIG. 9 shows the reflected beams as emanating from the glass panel 1 when flat and when bent. When the glass panel 1 is flat, the reflected beam emanates from a point P on the flat glass panel (which can otherwise be treated as emanating from a virtual image A') and when the glass panel 1 is bent, the reflected beam emanates from a point Q on the bent glass panel (which can otherwise be treated as emanating from a virtual image A"). Thus, with respect to an imaginary normal line corresponding to the pinhole camera 601 the reflected beam makes an angle $\alpha$ when the reflection is from a flat glass panel and makes an angle different $\alpha$ ($\beta$ in this case) when the reflection is from a bent glass panel.

Figure 10:
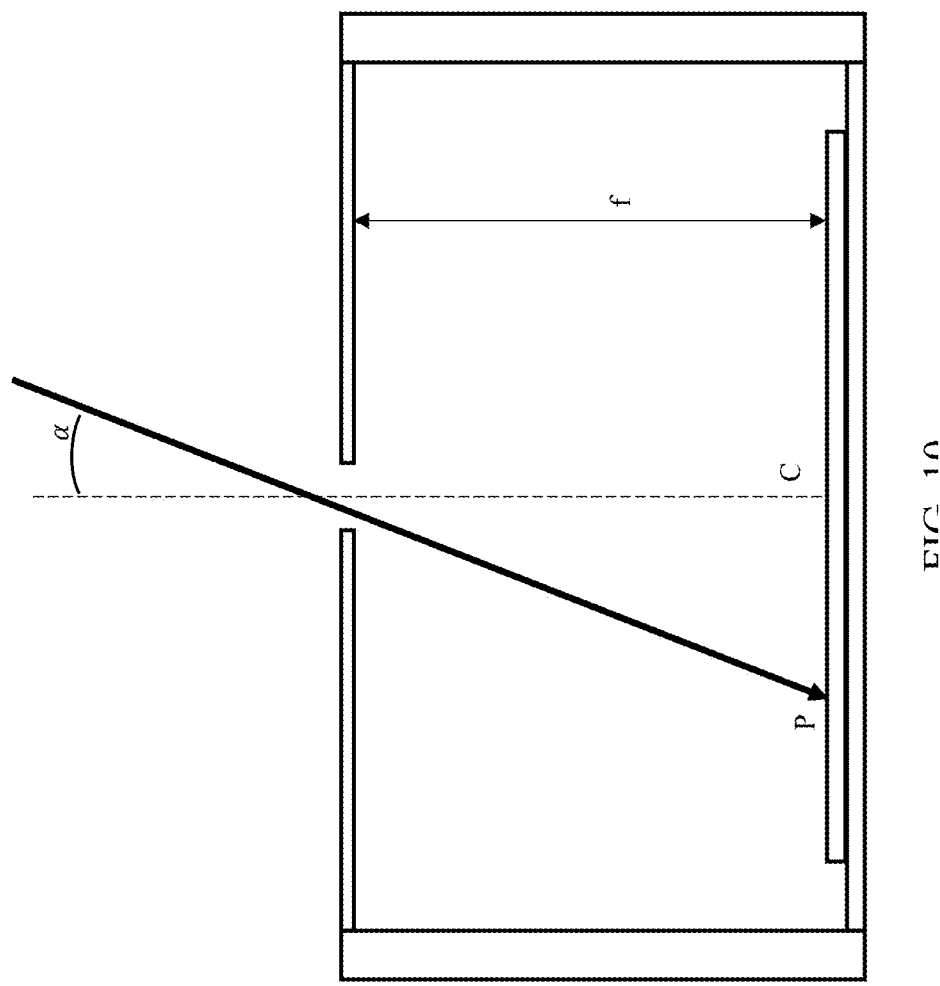
FIG. 10 illustrates measurement of an angle of incoming light from the surface of a glass panel, in accordance with an embodiment of the present disclosure.
Figure 11:
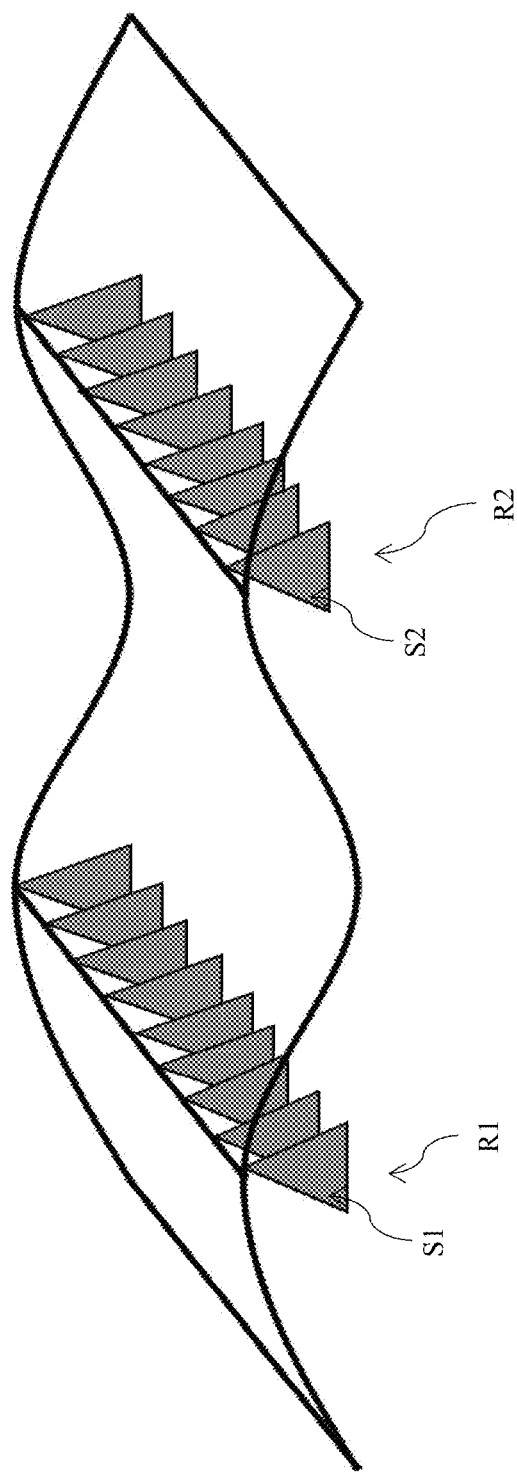
FIG. 11 illustrates a glass panel supported on two parallel rows including a series of linearly placed edge defining elements, in accordance with an embodiment of the present disclosure.

Apart from capturing the reflected beam, it is also possible to detect the value of the angle which the reflected beam makes with the imaginary normal line corresponding to the pinhole camera. Referring to FIG. 10, based on knowledge of: (a) a distance "f" between a point of entry of the reflected beam (into the pinhole camera) and a plane of formation of the image; and, (b) a distance "d" between a location of formation of the image P on the plane of formation of the image and a centre C of the pinhole camera, it is possible to calculate the value of the angle which the reflected beam makes with the imaginary normal line corresponding to the pinhole camera.

Assuming that the glass panel was flat prior to the thin film deposition and if an angle of reflected beam is undergoing a change, then it can be inferred that the glass panel has become bent because of the stresses developed in the thin-film. Also, a difference between the angles $\alpha$ and $\beta$ may be used to derive a vertical displacement as undergone by the glass panel because of the thin-film deposition. For example, more is the vertical displacement; more will be the value of a difference between the angles $\alpha$ and $\beta$.

In particular, the angles $\alpha$ and $\beta$ may be used to derive an extent of bend in the glass panel, which may be contributed for example by the radius of curvature as developed in the glass panel because of the stress developed in the thin-film deposited thereupon. In particular, more is the radius of curvature as developed in the glass panel more will be the value of a difference between the angles $\alpha$ and $\beta$.

In one example, the detector 606 may detect the topography of the glass panel 1 based on the vertical displacement as derived from a difference between the angles $\alpha$ and $\beta$.

Figure 12:
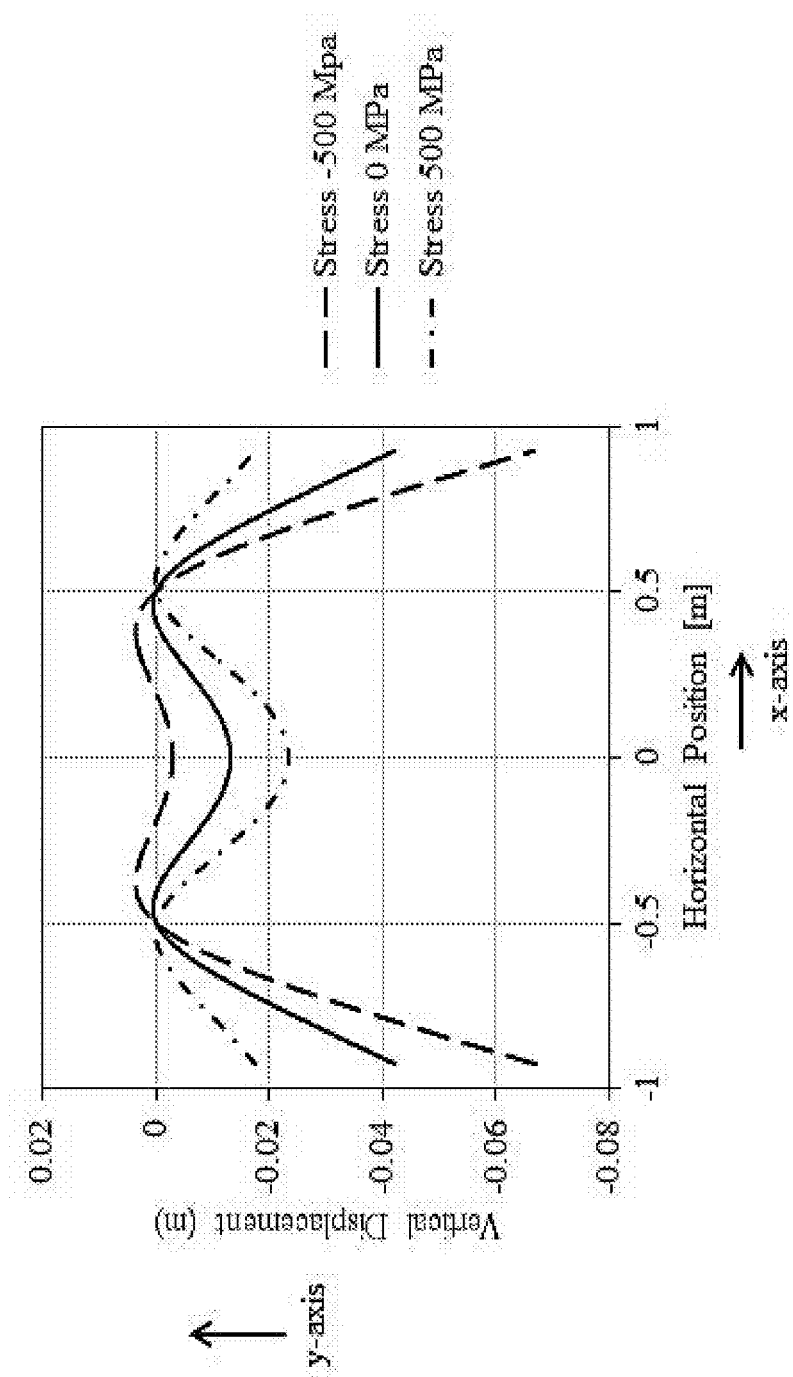
FIG. 12 illustrates a graph representing vertical displacements in a substrate for various values of intrinsic stress in a thin-film deposited on the substrate, in accordance with an embodiment of the present disclosure.

FIG. 12 illustrates another arrangement of support of a bent glass panel 1. As shown in FIG. 12, the bent glass panel 1 is supported from below by two parallel rows R1 and R2. In some embodiments, the row R1 may include a series of linearly placed edge defining elements S1. In some embodiments, the row R2 may include a series of linearly placed edge defining elements S2. The series of the edge defining elements S1 from row R1 and the series of edge defining elements S2 from row R2 may be positioned symmetrically with respect to an axis of the glass panel, similar to the positioning of edge defining elements S1 and S2, as shown in FIG. 4. Although two rows have been illustrated in FIG. 12, the glass panel may be supported by several such rows R1 and R2, each including a series of linearly placed edge defining elements and the several parallel rows being positioned symmetrically with respect to an axis of the glass panel. The support arrangement of the substrate as illustrated in FIG. 12 may help allow easier access of robot-end effectors to the substrate thus placed. The robot-end effectors may include effector prongs that can easily insert between the rows of linearly placed edge defining elements.

Numerical Results

Figure 13:
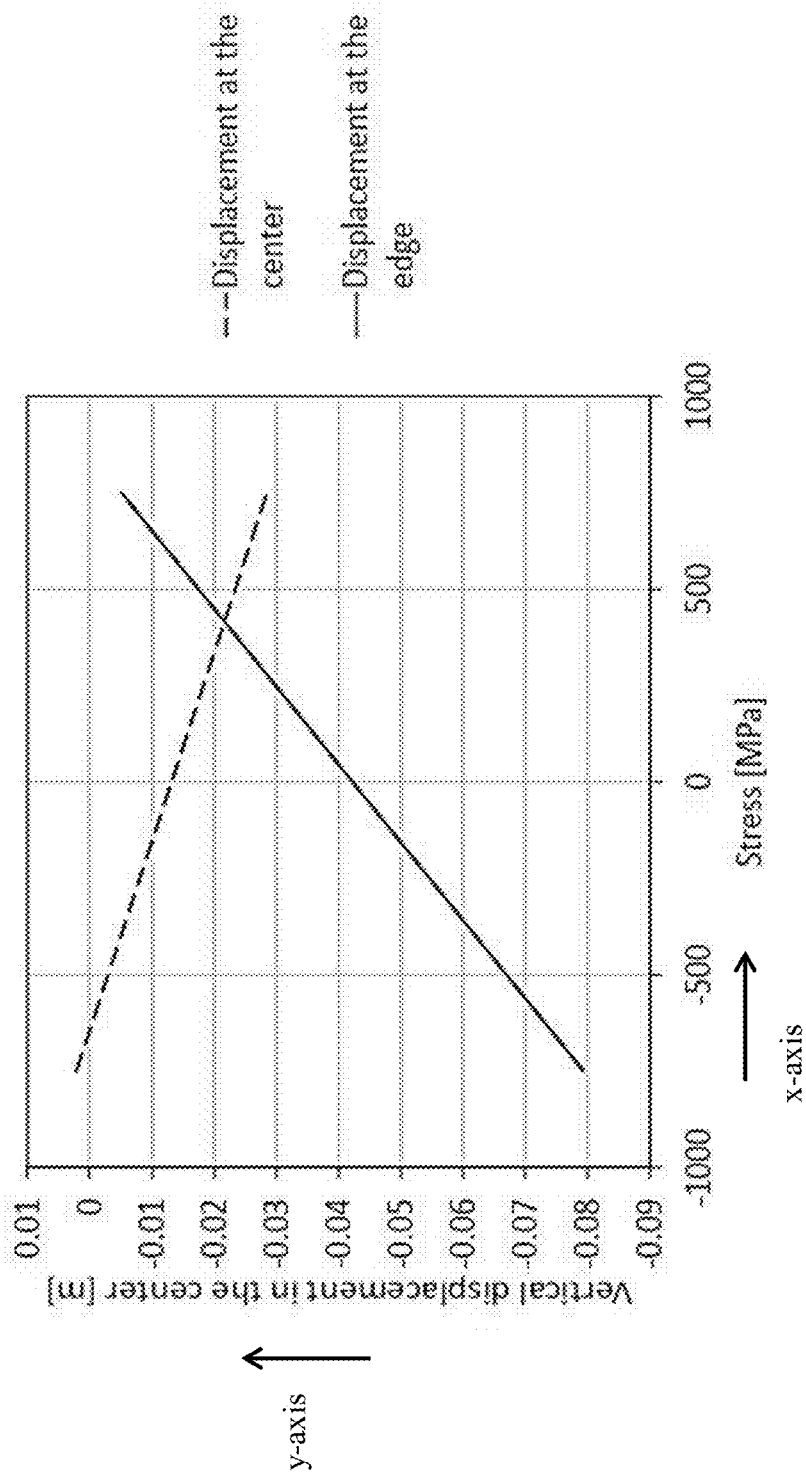
FIG. 13 illustrates a graph representing vertical displacements in the center and edges of the substrate, for various values of intrinsic stress in a thin-film deposited on the substrate, in accordance with an embodiment of the present disclosure.

A glass panel having the following physical characteristics is considered: Width W=1.85 m, Young's modulus EY=70.967E9 Pa, Poisson ratio v=0.23, density p=2.37E3 kg/m$^3$, thickness of the glass substrate h=0.7E−3 m, covered by film having thickness t=1E−6. On applying the methods of detecting stress in the thin-film deposited on the glass panel, as provided in the present disclosure, it was found that an intrinsic stress of −500 MPa (dashed line), 0 MPa (solid line) and +500 MPa (chain line), referring to a graph as illustrated in FIG. 12, had developed at different prescribed points of the substrate having a vertical displacement as shown in FIGS. 12 and 13, in presence of gravity. The graph as illustrated in FIG. 12 and referred herein, represents the different prescribed points as horizontal position along the x-axis of the graph, assuming that the glass panel is positioned on a support arrangement as illustrated in FIG. 4. Further, the graph represents the vertical displacements for a prescribed point on the glass panel along the y-axis of the graph—The free fall acceleration is assumed as g=9.8 m/s2. Further, the glass panel is assumed to be a rectangular shaped glass panel having dimensions 650 mm×550 mm.

Further, a graph illustrated in FIG. 13, illustrates the values of intrinsic stress developed in the thin-film deposited on the glass panel for different values of vertical displacement in the center region of the glass panel and regions near the edges of the glass panel. The graph as illustrated in FIG. 13 represents the values of intrinsic stress along the x-axis of the graph, assuming that the glass panel is positioned on a support arrangement as illustrated in FIG. 4. Further, the graph represents the values for the vertical displacements of the glass panel along the y-axis of the graph.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated. In this description, a "computing entity" may be any computing system as previously defined in the present disclosure, or any module or combination of modulates running on a computing system.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

To the extent that method or apparatus embodiments herein are described as having certain numbers of elements, it should be understood that fewer than all of the elements may be necessary to define a complete claim. I in addition, sequences of operations or functions described in various embodiments do not require or imply a requirement for such sequences in practicing any of the appended claims. Operations or functions may be performed in any sequence to effectuate the goals of the disclosed embodiments.

What is claimed is:

1. An apparatus for non-contact based measurement of stress in a thin-film deposited on a substrate, the apparatus comprising:
    a topography measurement unit comprising:
        at least one LED panel configured to emit a beam of light towards a surface of a substrate; and
        at least one camera configured to capture a reflected beam of light that includes at least a portion of the emitted beam as reflected from the surface of the substrate; and
        a detector unit configured to detect a change in an optical path of the reflected beam of light to determine topography data of the substrate; and
    a processor configured to:
    compare first topography data of the substrate having a thin-film deposited thereupon with second topography data of the substrate that is measured prior to the thin-film deposition;
    obtain a vertical displacement of the substrate based on the comparison between the first topography data and the second topography data;
    determine one or more coefficients of a fourth-order polynomial equation that is used to determine a calculated shape of the substrate for different values of stress in the thin-film deposited on the substrate, wherein the one or more coefficients are determined based on the vertical displacement such that the calculated shape as determined from the fourth-order polynomial is similar to an actual shape of the substrate; and
    detect a stress value in the thin-film deposited on the substrate based on the fourth-order polynomial equation with the determined one or more coefficients.

2. The apparatus as claimed in claim 1 wherein the substrate is supported from below by a first edge defining element and a second edge defining element separated by a predefined separating value, the first and second edge defining elements being positioned symmetrically with respect to an axis of the substrate.

3. The apparatus as claimed in claim 1 wherein the substrate is supported from below by at least two parallel rows including a series of linearly placed edge defining elements, the series of linearly placed edge defining elements of each of the two parallel rows being positioned symmetrically with respect to an axis of the substrate.

4. The apparatus as claimed in claim 1, wherein the fourth-order polynomial equation includes:
    a first polynomial equation corresponding to a center region of the substrate, the center region being proximate to a center of symmetry of the substrate; and
    a second polynomial equation corresponding to a further region of the substrate, the further region being away from the center region of the substrate.

5. An apparatus for non-contact based measurement of stress in a thin-film deposited on a substrate, the apparatus comprising:
    a plurality of LED panels configured to emit an emitted beam of light towards a surface of a substrate; the plurality of LED panels being arranged to include an opening at about a center for allowing flow of filtered air above the surface of the substrate;
    a plurality of cameras configured to capture a reflected beam of light that includes at least a portion of the emitted beam as reflected from the surface of the substrate;
    a detector unit to determine topography data of the substrate prior to a thin-film deposition and after the thin-film deposition on the substrate, wherein the detector unit is configured to detect a change in optical path of the reflected beam of light to determine the topography data of the substrate; and
    a processor configured to cause performance of operations comprising:
        compare first topography data of the substrate having a thin-film deposited thereupon with second topography data of the substrate that is measured prior to the thin-film deposition;
        obtain a vertical displacement of the substrate based on the comparison between the first topography data and the second topography data;
        determine one or more coefficients of a fourth-order polynomial equation that is used to determine a calculated shape of the substrate for different values of stress in the thin-film deposited on the substrate, wherein the one or more coefficients are determined based on the vertical displacement such that the calculated shape as determined from the fourth-order polynomial is similar to an actual shape of the substrate; and
        detect a stress value in the thin-film deposited on the substrate based on the fourth-order polynomial equation with the determined one or more coefficients.

6. The apparatus as claimed in claim 5 wherein the fourth-order polynomial equation includes:
    a first polynomial equation corresponding to a center region of the substrate, the center region being proximate to a center of symmetry of the substrate; and
    a second polynomial equation corresponding to a further region of the substrate, the further region being away from the center region of the substrate.

7. The apparatus as claimed in claim 5 wherein the fourth-order polynomial equation includes coefficients determined by optimizing a total potential energy acting upon the substrate having the thin-film deposited thereupon.

8. The apparatus as claimed in claim 7 comprising predicting a curvature of the substrate using the determined coefficients.

* * * * *